Dec. 6, 1966 J. E. RACY 3,290,614

HIGH FREQUENCY OSCILLATOR HAVING DISTRIBUTED PARAMETER RESONANT CIRCUIT

Filed March 20, 1964

INVENTOR

JOSEPH E. RACY

BY

Louis Ettinger

ATTORNEY

United States Patent Office 3,290,614
Patented Dec. 6, 1966

3,290,614
HIGH FREQUENCY OSCILLATOR HAVING DISTRIBUTED PARAMETER RESONANT CIRCUIT

Joseph E. Racy, Nashua, N.H., assignor to Sanders Associates, Inc., Nashua, N.H., a corporation of Delaware
Filed Mar. 20, 1964, Ser. No. 353,424
14 Claims. (Cl. 331—117)

This invention relates to a signal source particularly suitable for operation at microwave frequencies.

More specifically, the invention provides a solid state oscillator that combines the reactive parameters of a solid state device such as a transistor with the parameters of a distributed parameter resonant circuit such as a cavity. The oscillator develops a relatively high-power output signal and has good frequency stability.

Prior oscillators operating at microwave frequencies generally employ vacuum tubes and klystrons. Such sources present mechanical shock and vibration problems. Further, they require relatively high operating voltages in addition to large cathode heater currents. Overcoming these disadvantages incurs a relatively high cost. Moreover, vacuum tube and klystron devices dissipate substantial heat and are relatively bulky.

Accordingly, it is an object of the present invention to provide a relatively efficient and compact microwave oscillator.

Another object of the invention is to provide a mechanically rugged microwave oscillator that withstands mechanical shock and vibration. More particularly, it is an object to provide an oscillator of the above character whose output frequency is relatively unaffected by strong mechanical disturbances.

Another object of the invention is to provide a transistor oscillator of the above character having a relatively stable output frequency.

A further object of the invention is to provide a microwave oscillator of the above type that has small size and light weight.

Another object of the invention is to provide an oscillator of the above type that produces relatively no radio frequency interference.

It is also an object of the invention to provide an oscillator of the above character that can readily be amplitude modulated, frequency modulated, and electronically tuned.

Other objects of the invention will in part be obvious and will in part appear hereinafter.

The invention accordingly comprises the features of construction, combination of elements, and arrangement of parts which will be exemplified in the constructions hereinafter set forth, and the scope of the invention will be indicated in the claims.

For a fuller understanding of the nature and objects of the invention, reference should be had to the following detailed description taken in connection with the accompanying drawings, in which.

An oscillator embodying the invention comprises a transistor assembled with a distributed parameter resonant circuit to make use of internal reactances of the transistor in conjunction with those of the resonant circuit. A three-reactance feedback oscillator embodying the invention employs a transistor mounted on a resonant cavity and connected to the cavity at a region of relatively intense electric field. The fundamental frequency of the output signal from such an oscillator has exceeded 1 g.c., i.e. $1\times10^9$ c.p.s., with a power in excess of 20 milliwatts.

A plurality of transistors can be operated in parallel in this manner with a single cavity to provide a compact and efficient source generating an output power as high as 100 milliwatts.

Figures 1, 2:
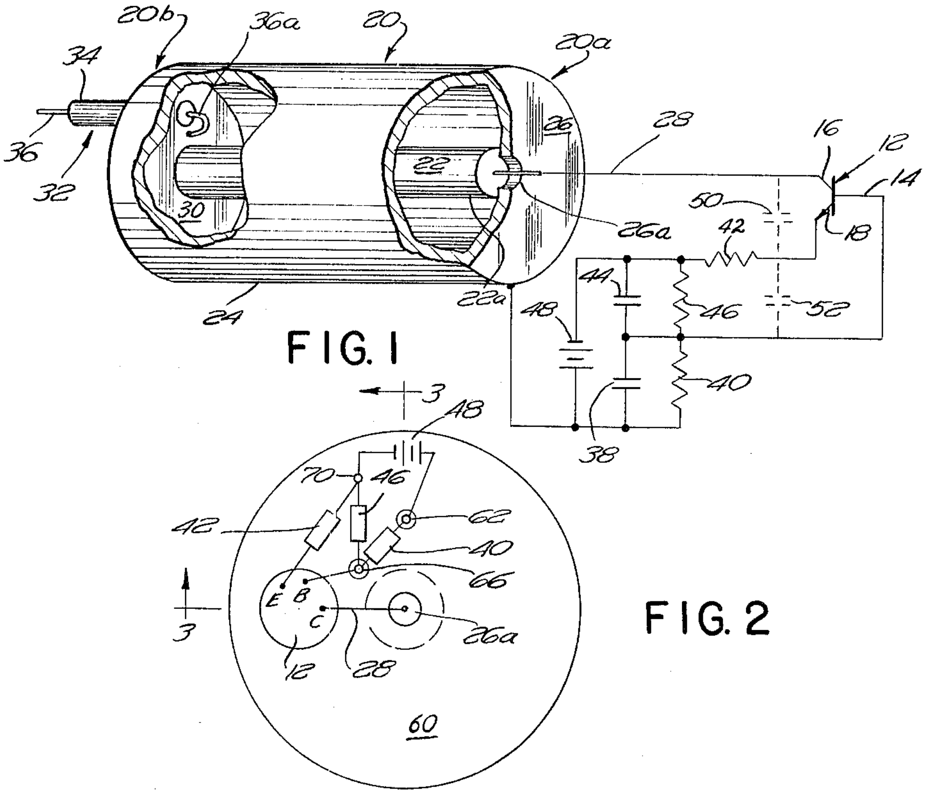
FIG. 1 is a representation, partly in schematic form, of a microwave oscillator embodying the invention.
FIG. 2 is a plan view of a microwave oscillator constructed according to the invention.

More specifically, FIG. 1 shows such an oscillator comprising a single transistor 12 having a base terminal 14, a collector terminal 16 and an emitter terminal 18. The illustrated oscillator also employs a coaxial cavity, indicated generally at 20, constructed with an inner conductor 22 coaxial with an outer conductor 24.

At its end 20*a*, the cavity 20 has a conductive end wall 26 axially spaced from the inner conductor 22 and connected to the outer conductor 24. A lead 28 connecting the transistor collector terminal 16 with the inner conductor 22 passes through the wall 26 at a central hole 26*a*.

A conductive end wall 30 forms a short circuit between the inner and outer conductors of the cavity at its other end 20*b*. The inner conductor 22 has a length of approximately a quarter-wavelength at the frequency of oscillation so that the short circuit of wall 30 appears as a high impedance between the inner and outer conductors at the cavity end 20*a*.

The end wall 30 is fitted with an oscillator output probe 32 comprising an outer conductor 34 connected with the wall 30 and supporting a coaxial inner conductor 36 that protrudes into the cavity and forms a conventional coupling loop 36*a*.

In addition to the connection between the cavity inner conductor and the transistor collector terminal, the outer conductor 24 is connected to the transistor base terminal 14 through a bypass capacitor 38 in parallel with a resistor 40. A resistor 42 is in series with the parallel combination of a bypass capacitor 44 and a resistor 46 between the emitter terminal 18 and the base terminal 14.

A direct current supply shown as a battery 48 provides the electrical bias and operating power for the transistor 12. As is conventional with the illustrated npn transistor, the battery 48 makes the collector terminal 16 positive with respect to the emitter terminal 18 and, by means of resistors 40 and 46, maintains the base terminal 14 at an intermediate voltage.

The oscillator of FIG. 1 also utilizes internal reactances of the transistor 12, including a capacitance 50 appearing between the collector terminal and the emitter terminal and a capacitance 52 between the emitter terminal and the base terminal.

The resultant circuit is a three-reactance oscillator of the Colpitts type. The cavity 20 provides one reactance and the internal capacitances 50 and 52 of the transistor form the other two reactances. Conventional feedback oscillators of the three-reactance type, including the Colpitts oscillator, are described at pages 107–111 of Department of the Army Technical Manual TM 11–673 (June 1953).

As noted above, the resistors 40 and 46 primarily determine the direct current operating conditions of the transistor. The capacitors 38 and 44 have negligible radio frequency impedance and hence bypass the radio frequency signals around the resistors 40 and 46. The resistor 42 prevents the bypass capacitor 44 from shunting the internal capacitance 52 of the transistor, and also limits the emitter current.

During operation, at a frequency slightly different from its resonant frequency, the cavity 20 has an inductive reactance much greater than the capacitive reactance of the internal capacitance 52, which is in series with it. Accordingly, at this frequency, the combination of the cavity and the capacitance 52 presents an inductance to the transistor between its collector terminal and its emitter terminal. The other internal capacitance 50 resonates with this inductance at the frequency of oscillation. The current in the capacitance 52 develops a voltage between the emitter terminal and the base terminal having the proper phase for regenerative feedback at this frequency.

It will be noted that the cavity 20, from which the oscillator output is coupled, is between the collector and base terminals of the transistor 12. The transistor has a high output impedance between these terminals, thereby maximizing the Q of the cavity. Since the base terminal is common to both the input and output of the transistor, it can be considered as connected in a common base configuration.

Figure 3:
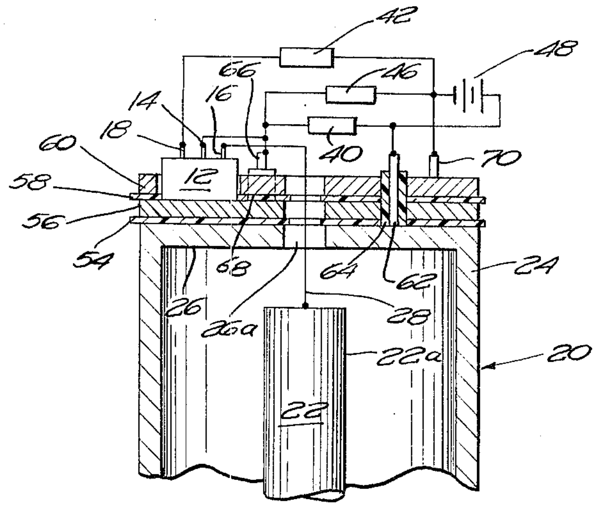
FIG. 3 is a cross-sectional view of the oscillator of FIG. 2.

The oscillator of FIG. 1 is preferably constructed as shown in FIGS. 2 and 3 by assembling the entire circuit, with the possible exception of the supply battery 48, directly on the cavity adjacent its end 20*a*. For this purpose, as shown in FIG. 3, a lower insulator 54, an intermediate conductive plate 56, an upper insulator 58, and a top conductive plate 60 are stacked in succession on the end wall 26. Each of these elements is an annular disk having a central hole aligned with the hole 26*a* in the end wall.

A terminal post 62 protrudes from the end wall 26 through the elements 54–60, and a dielectric collar 64 encloses the post and insulates it from the plates 56 and 60. Similarly, protruding from the plate 56 is a terminal post 66 enclosed within an insulating collar 68. A terminal post 70 extends a short distance from the top plate 60.

The conductive plates 56 and 60 and the insulators 54 and 58 can be affixed to the end wall 26 with high quality adhesive or, alternatively, with screws (not shown) insulated from the plates 56 and 60 and engaging the end wall 26.

The top plate 60 and the upper insulator 58 are cut away to receive the transistor 12, which preferably has its case connected to the inner plate 56, as by soldering. It should be noted that with the illustrated construction, none of the transistor terminals are internally connected to the transistor case, which generally is electrically conductive. Nevertheless, it is preferable that the transistor be mounted, as shown, with its case connected to the plate 56, which has a low capacitive reactance to the cavity outer conductor 24.

The lead 28 from the collector terminal 16 passes through the central holes in the elements 54–60 and the plate 26 for a direct connection to the end 22*a* of the cavity inner conductor 22. The transistor base terminal 14 is connected to the terminal post 66, from which the resistor 40 is connected to the terminal post 62 and the resistor 46 is connected to the terminal post 70. The resistor 42 is connected between the post 70 and the emitter terminal 18. The wires used in making these connections are kept as short as possible, particularly the lead 28, the connection from the emitter terminal 18 through the resistor 42 to the post 70, and the connection from the base terminal 14 to the post 66; each of these paths conducts high radio frequency signals.

Although for clarity the resistors 40, 42 and 46 are shown in FIG. 3 as being spaced from the top plate 60, in practice they are closely adjacent to it. Where desired, an insulator may be provided between the resistors and the top plate. A high quality dielectric adhesive is appropriate for securing the resistors in place.

Referring to FIGS. 1 and 3, the bypass capacitor 38 of FIG. 1 is provided in FIG. 3 between the cavity wall 26 and the conductive disk 56, to which connections are made via the terminal post 66. The capacitance between the conductive disks 60 and 56 is the bypass capacitor 44 of FIG. 1.

An oscillator constructed as thus described has developed 20 milliwatts at L band frequencies, i.e. $10^9$ c.p.s. The output frequency is stable with respect to changes in ambient temperature to approximately one part in $10^6$ per degree centrigrade. The frequency stability is enhanced with the use of Invar, or other material having a low thermal expansion coefficient, for the cavity. However, relatively high stability is realized with brass and aluminum cavity conductors.

The capacitance between the conductive plates 56 and 60 and the cavity outer conductor end wall, and between the transistor case and these conductors is such that the source radiates essentially no radio frequency interference. Such interference has become an increasingly onerous problem to the communication engineer and, accordingly, the absence thereof with the present construction is particularly desirable.

Although only a single transistor has been shown assembled on the cavity 20, a plurality of transistors can be assembled in this manner on a single cavity end plate and operated in parallel to provide a stable compact source. Moreover, the oscillator can be electronically tuned, amplitude modulated, and/or frequency modulated according to conventional practices, as by electronically tuning the resonant frequency of the cavity 20 with a voltage controllable capacitance device such as a varactor disposed within the cavity.

It should also be understood that the coaxial cavity 20 is representative of distributed parameter resonant circuits in general, and includes such compact constructions as strip transmission line devices.

In summary, the oscillator described above combines a transistor with a distributed parameter resonant circuit so that the internal reactances of the semiconductor device cooperate with the reactances of the resonant circuit in an efficient manner. The frequency of the oscillator is relatively stable with respect to mechanical disturbances and changes in ambient temperature. Moreover, the circuit requires only a few components and the oscillator can be fabricated at low cost.

By constructing the oscillator with the transistor in close proximity to the high impedance region of the resonant circuit, efficient coupling at microwave frequencies is achieved between the resonant circuit and the transistor. Whereas comparable operation of vacuum tubes required the development of lighthouse and planar designs, the present circuit construction utilizes the transistor geometry conventional for low frequency lumped parameter circuits.

It will thus be seen that the objects set forth above, among those made apparent from the preceding description, are efficiently attained and, since certain changes may be made in the above constructions without departing from the scope of the invention, it is intended that all matter contained in the above description or shown in the accompanying drawings shall be interpreted as illustrative and not in a limiting sense.

It is also to be understood that the following claims are intended to cover all of the generic and specific features of the invention herein described, and all statements of the scope of the invention which, as a matter of language, might be said to fall therebetween.

Having described the invention, what is claimed as new and secured by Letters Patent is:

1. A three-reactance radio frequency oscillator comprising, in combination, (A) a coaxial distributed parameter resonant circuit having an inner line and outer shield forming a first oscillator reactance, said inner line and outer shield (1) forming first and second spaced conductive sections, (2) possessing a resonant frequency at which the energy therein has an electric field component between said conductive sections, (B) a transistor having a first current carrying terminal, a second current carrying terminal and a third control terminal, (1) said transistor having an internal capacitance between said first and second current carrying terminals forming a second oscillator reactance,
(2) said transistor having a further internal capacitance between said first current carrying terminal and said control terminal forming a third oscillator reactance,
(3) said first current carrying terminal being connected to one of said spaced conductive sections,
(4) said second current terminal being connected to the other of said spaced conductive sections,
(5) said three reactances substantially determining the frequency of oscillation of said oscillator,
(C) a source of potential,
(D) a bias circuit,
(1) connected in parallel with said source of potential,
(2) said bias circuit comprising a resistive voltage divider,
(a) one end of said voltage divider being connected to one of said spaced conductive sections, and
(b) the other end thereof being connected through an impedance to said first current carrying terminal,
(3) said control terminal being connected to said resistive voltage divider intermediate the ends thereof,
(4) capacitive means connected in parallel with said resistive voltage divider, and
(5) means interconnecting intermediate points of said capacitive means and said resistive voltage divider.

2. The oscillator defined in claim 1, wherein said first current carrying terminal, said second current carrying terminal and said control terminal of said transistor are the emitter, the collector and the base, respectively.

3. The oscillator defined in claim 1, wherein said resonant circuit is a transmission line having one end thereof short-circuited.

4. The oscillator defined in claim 1, wherein said resistive voltage divider consists of at least two resistors.

5. The oscillator defined in claim 4, wherein said capacitive means consists of at least two capacitances.

6. The oscillator defined in claim 1, wherein
(A) said resistive voltage divider comprises first and second serially connected resistors,
(B) said first resistor being connected between said impedance and said control terminal, and
(C) said second resistor being connected between said control terminal and said one of said spaced conductive sections.

7. The oscillator defined in claim 6, wherein
(A) said capacitive means comprises first and second serially connected capacitances,
(B) said first capacitance being connected in parallel with said first resistor,
(C) said second capacitance being connected in parallel with said second resistor, and
(D) said interconnecting means are positioned between said first and second resistors and said first and second capacitances, respectively.

8. The oscillator defined in claim 7, wherein
(A) said first and second capacitances are bypass capacitances, and
(B) said second bypass capacitance has a first capacitance plate formed by said outer shield.

9. The oscillator defined in claim 1, wherein said resonant circuit is a cavity.

10. The oscillator defined in claim 2, wherein said transistor has a high impedance between said collector and base terminals.

11. The oscillator defined in claim 1, wherein said resonant circuit includes means for coupling the output signal from said oscillator.

12. The oscillator defined in claim 1,
(A) in which said resonant circuit is a cavity having an outer wall forming said second conductive section,
(B) further comprising a first conducting plate outside said cavity, closely spaced and insulated from said outer wall so as to be capacitively coupled thereto,
(1) said first plate being connected to said first current carrying terminal,
(C) further comprising a second conducting plate outside said cavity, closely spaced and insulated from said outer wall so as to be capacitively coupled thereto, and
(1) said second plate being connected to said control terminal.

13. A radio frequency oscillator comprising in combination
(A) a resonant transmission line having an inner conductor and an outer conductor, said inner and outer conductors having an impedance between them at a first end of said transmission line which is substantially greater than the characteristic impedance of the transmission line,
(B) a cavity end wall connected to said outer conductor at said first end of said transmission line and having a central hole therein,
(C) a first insulating sheet secured on said end wall,
(D) an inner conductive plate secured on said first insulating sheet and closely spaced from said end wall,
(E) a second insulating sheet secured on said inner conductive plate,
(F) a top conductive plate secured on said second insulating sheet and closely spaced from said inner conductive plate,
(G) means forming an aperture through said first and second insulating sheets and said inner and top conductive plates, and communicating with said central hole in said end wall,
(H) a transistor mounted on and connected to one of said conductive plates,
(1) said transistor having an emitter terminal, a base terminal and a collector terminal,
(2) said transistor having a first internal capacitance between its collector and emitter terminals and a second internal capacitance between its base and emitter terminals,
(I) a two-terminal resistive element connected at one terminal thereof to said emitter terminal and at the other terminal thereof to said top conductive plate,
(1) said base terminal being connected to said inner conductive plate,
(J) first capacitance means formed by the capacitance between said inner conductive plate and said end wall and connected between the other terminal of said resistive element and said outer conductor and serving as a bypass capacitor,
(K) a first resistor in parallel with said first capacitance means,
(L) second capacitance means formed by the capacitance between said top conductive plate and said end wall and connected between said base terminal and said outer conductor and serving as a bypass capacitor,
(M) a second resistor in parallel with said second capacitance means,
(N) a source of potential connected between said other terminal of said resistive element and said outer conductor, and
(O) said collector terminal being connected through said aperture and the hole in the end wall to the inner conductor of said transmission line.

14. The oscillator defined in claim 13 in which
(A) said end wall has a first terminal post connected thereto and protruding to above said top plate,
(B) said inner plate has a second terminal post connected thereto and protruding to above said top plate, (1) said base terminal being connected to said second terminal post for connection to said inner plate, (2) said second resistor being connected between said first terminal post and said second terminal post, (3) said first resistor being connected between said second terminal post and said top plate, and (C) said top plate and said second insulating sheet being cut away to receive said transistor with its case connected to said inner plate.

References Cited by the Examiner

UNITED STATES PATENTS

| | | | |
|---|---|---|---|
| 2,817,761 | 12/1957 | Hollmann | 331—117 |
| 3,189,823 | 6/1965 | Mitchell | 331—177 |

OTHER REFERENCES

Nelson et al.: Proc. of the IRE, "A Five-Watt Ten Megacycle Transistor," vol. 46, No. 6, June 1958, pp. 1209–1215.

ROY LAKE, *Primary Examiner.*

J. KOMINSKI, *Assistant Examiner.*